United States Patent [19]

Yamamoto

[11] 4,093,883
[45] June 6, 1978

[54] PIEZOELECTRIC MULTIMORPH SWITCHES

[76] Inventor: Yujiro Yamamoto, 2001 S. Eastwood, Santa Ana, Calif. 92705

[21] Appl. No.: 789,185

[22] Filed: Apr. 20, 1977

Related U.S. Application Data

[63] Continuation of Ser. No. 589,255, Jun. 23, 1975, abandoned, which is a continuation-in-part of Ser. No. 390,473, Aug. 8, 1973, abandoned, which is a continuation-in-part of Ser. No. 246,310, Apr. 21, 1972, abandoned.

[51] Int. Cl.² .......................................... H01L 41/10
[52] U.S. Cl. ...................................... 310/317; 310/332; 200/181
[58] Field of Search ............... 310/317, 328, 330–332; 200/181

[56] References Cited

U.S. PATENT DOCUMENTS

| 2,182,340 | 12/1939 | Hearn | 310/317 |
|---|---|---|---|
| 2,471,967 | 5/1949 | Mason | 200/181 X |
| 2,714,642 | 8/1955 | Kinsley | 310/332 X |
| 2,835,761 | 5/1958 | Crownover | 310/331 X |
| 2,928,069 | 3/1960 | Petermann | 310/328 X |
| 3,405,289 | 10/1968 | Gikow | 310/328 |
| 3,781,955 | 1/1974 | Lavrinenko | 310/330 X |

FOREIGN PATENT DOCUMENTS

| 273,157 | 7/1964 | United Kingdom | 200/181 |

OTHER PUBLICATIONS

IBM Technical Disclosure Bulletin, vol. 1, No. 5, Feb. 1959, Capacitive Relay by Green, p. 5.

*Primary Examiner*—Mark O. Budd
*Attorney, Agent, or Firm*—Grover A. Frater

[57] ABSTRACT

A multimorph is a piezoelectric element which moves or bends as an incident to being charged or otherwise subjected to an electrostatic field so that a potential gradient appears across the element. The amount of movement or bending can be sufficient to actuate electrical contacts whereby the multimorph is useful in switches and relays. Improved multimorph construction and mounting, improved contact construction and mounting, and improved arrangements for subjecting multimorphs to electrostatic charges to provide improved switching and relay units are disclosed. Such units may be incorporated in time delay systems and the manner in which that can be done is disclosed along with other applications.

12 Claims, 19 Drawing Figures

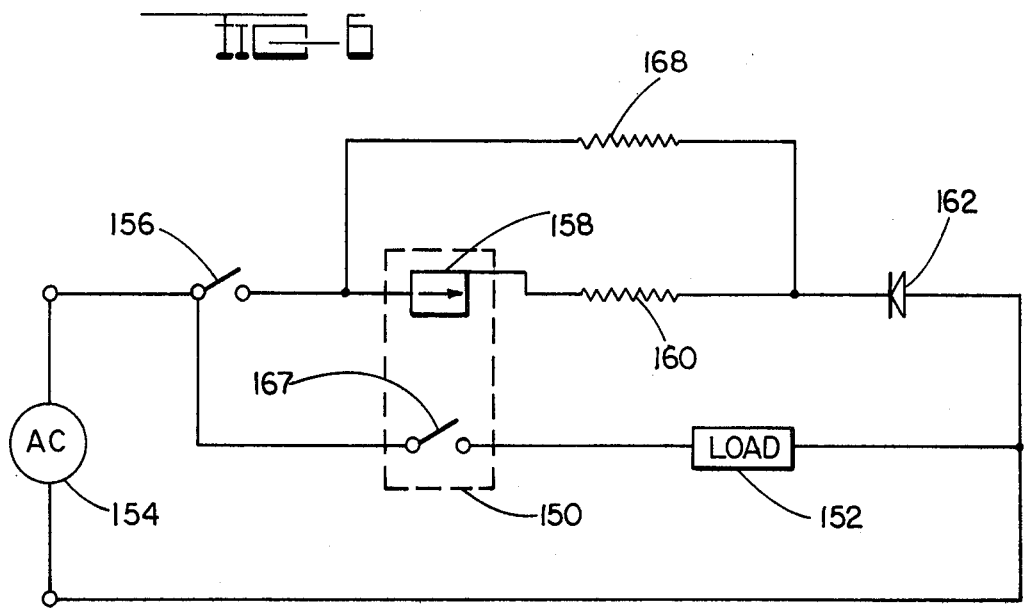
FIG-6
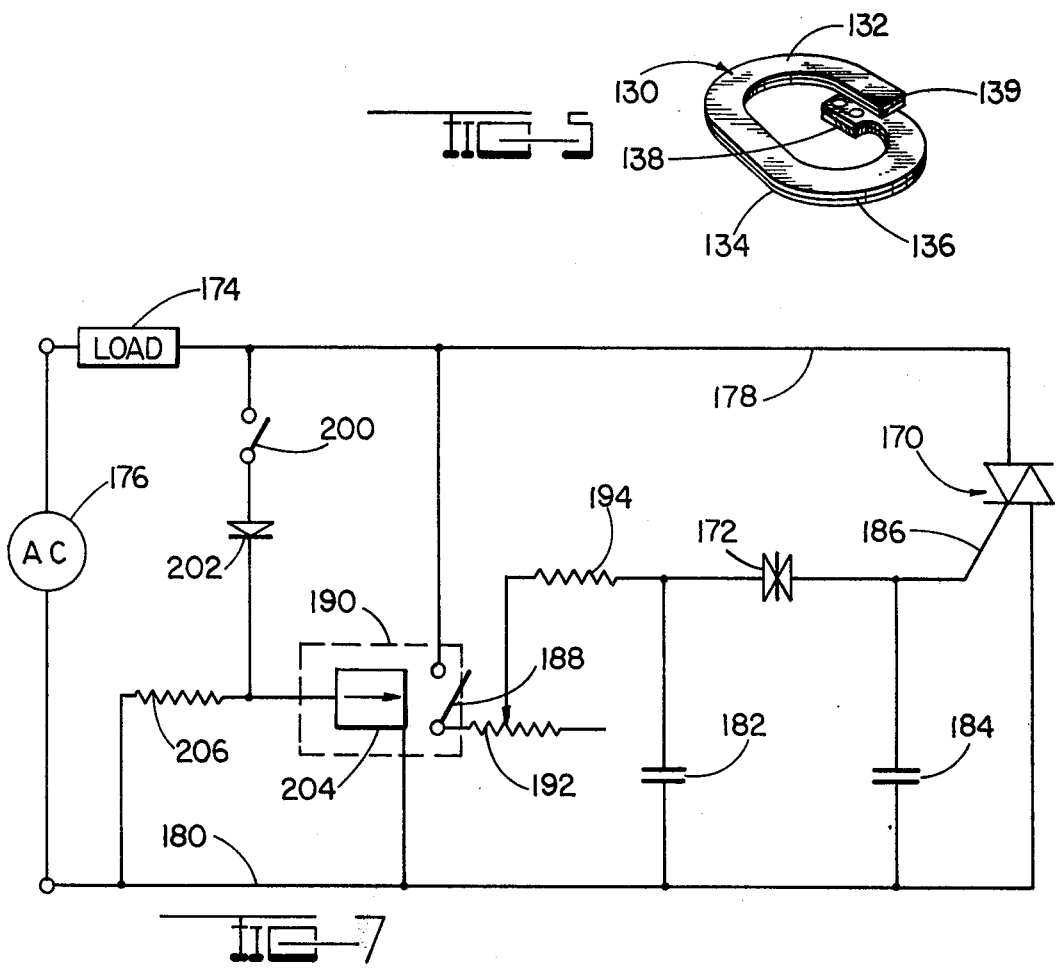
FIG-5
FIG-7

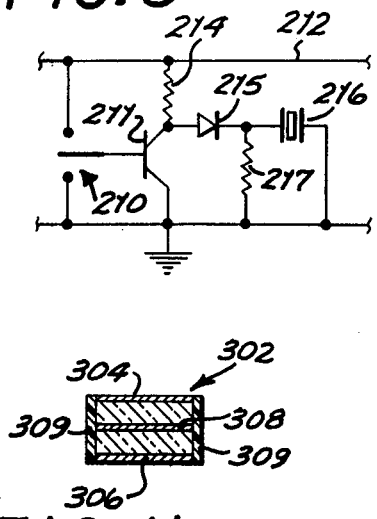
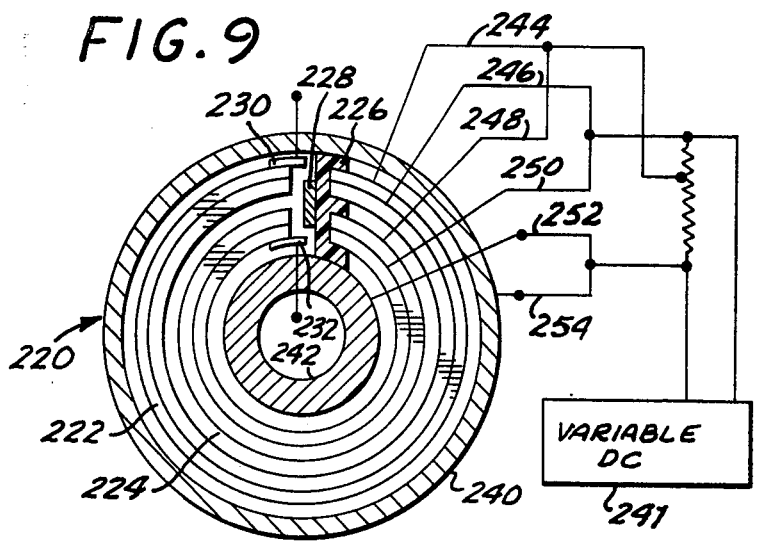
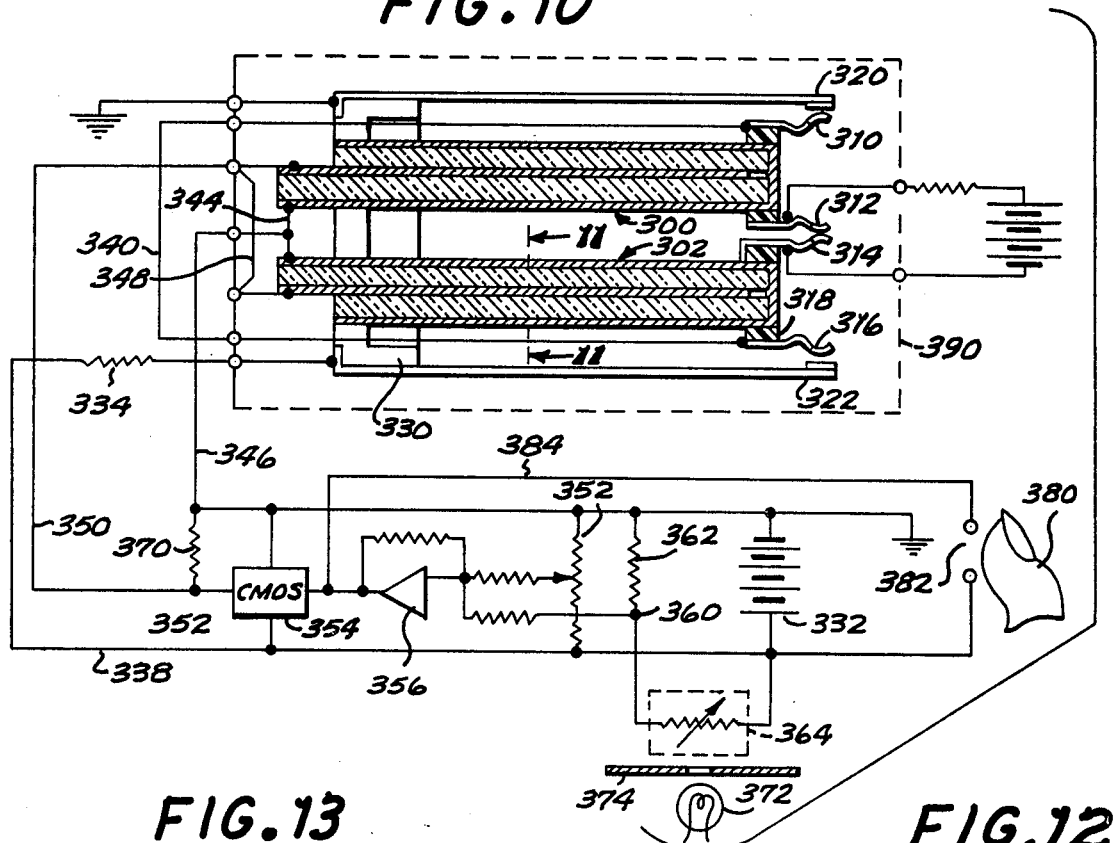
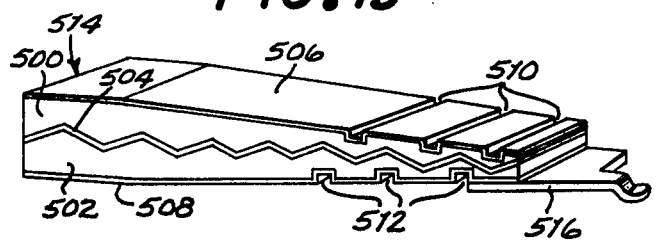
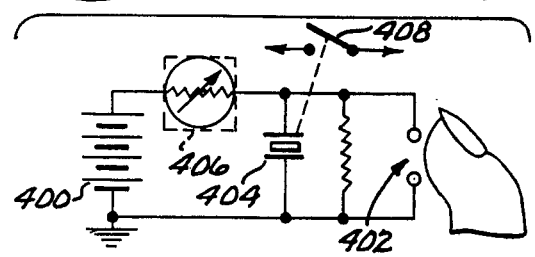

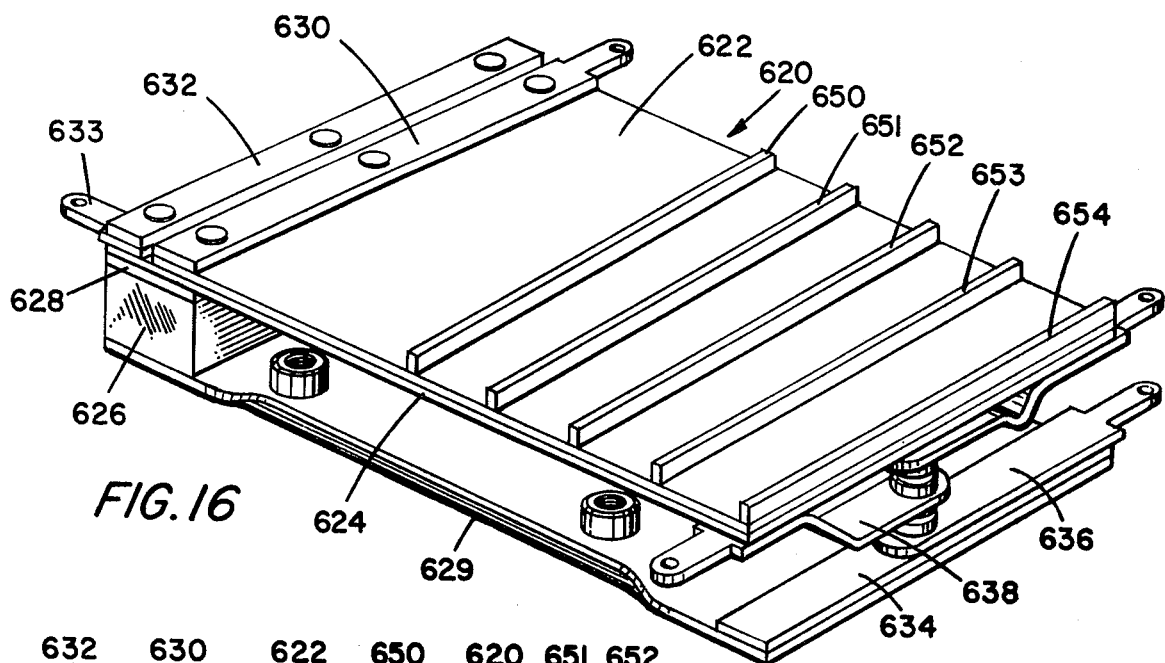
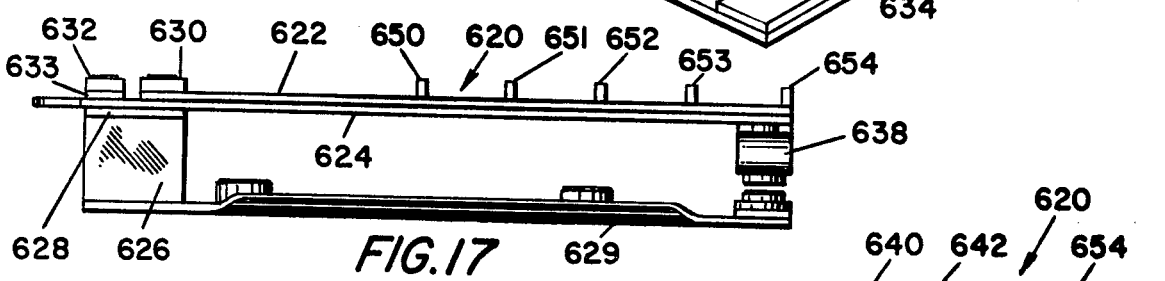
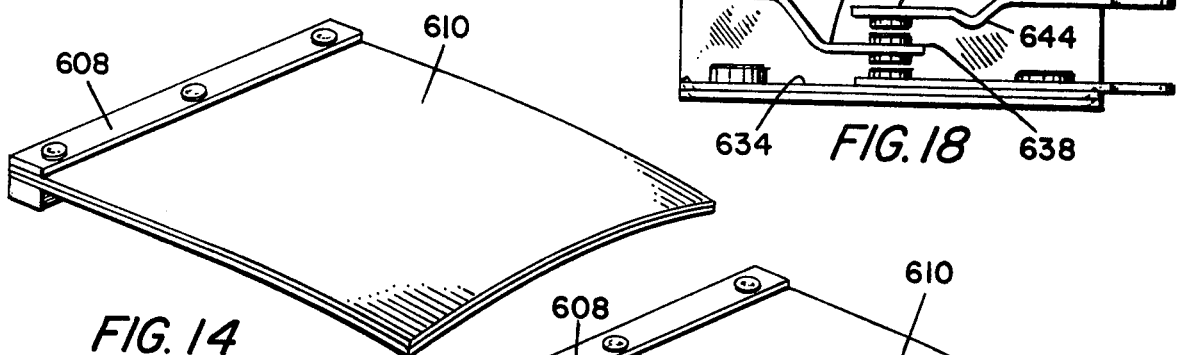
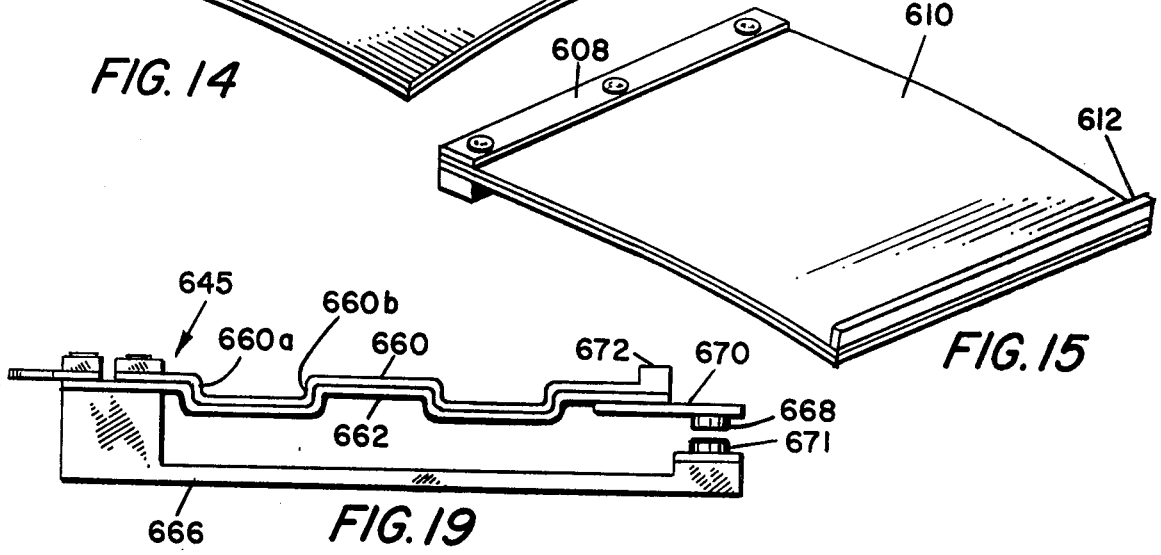

PIEZOELECTRIC MULTIMORPH SWITCHES

This invention relates to improvements in relays and switches and relay switch circuitry, and methods of operating relays and switches. This application is a Continuation-in-part of application, Ser. No. 589,255, filed June 23, 1975, which is to be abandoned; which was a Continuation-in-part of application, Ser. No. 390,473, filed Aug. 8, 1973, and now abandoned; which was a Continuation-in-part of application, Ser. No. 246,310, filed Apr. 21, 1972, which has been abandoned.

A number of attempts have been made in the past to utilize piezoelectric multimorph elements in the construction of switches and principally in the construction of relays. Piezoelectric materials are dielectric. Some bend when an electric field is applied across them. The amount of bending force varies with potential gradient. A sandwich formed of alternate layers of conductive material and piezoelectric material, arranged in parallel, exhibits the bending effect in maximum degree. When a parallel type multimorph is mounted at one point so that another point can respond to force as a cantilever, the degree of bending displacement of the portion that is free to move is a function of cantilever length squared. This suggests a "reed" type construction and multiple layers. In practice, two layers, when reasonably long, exhibit an amount of bending adequate to actuate a switch. A two layer multimorph is called a "bimorph". More particularly, a bimorph employs two layers of piezoelectric material having a conductive layer between them and a conductive layer at the opposite side of each of the piezoelectric layers.

An alternative construction employs a single layer of piezoelectric material, which changes dimension when subjected to an electric field and can flex, bonded to a non-piezoelectric material which can flex, but which does not change dimension. The result is a construction which bends in proportion to the voltage gradient across the piezoelectric member of the pair. That alternative form and other alternatives involving a single layer of piezoelectric material and elements to make it bend in response to electric field changes are included in the term "bimorph."

Notwithstanding that the degree of displacement in a multimorph, and even in a bimorph, is enough to operate a switch, the various attempts that have been made in the past to apply multimorphs to switch and relay operation have met with little commercial success. Sagging of the bimorph, failure to relate them to electrical contacts adequately in a mechanical sense, and inability to achieve repeatability in displacements have prevented their effective exploitation.

It is an object of the invention to overcome these deficiencies in early piezoelectric switches and to provide a practical and reliable switch that is relatively easy to manufacture and that can be mass produced at low cost. The invention provides means, both mechanical and electrostatic, for preventing sag and improving repeatability of displacement.

A major facet of the invention lies in the combination of the bimorph with resiliently mounted electrical contacts.

Waren P. Mason sometimes is called the father of piezoelectricity. His 1939 U.S. Pat. No. 2,166,763 is considered to be basic. Among other things, it includes a quantitative analysis of multimorph bending applied to a relay. Equation 14 of the patent is a statement of the force required to bend a piezoelectric crystal so that its end moves through a distance "$d$." Equation 11 of the patent relates displacement to electric field gradient. At Column 3 the patent includes the following statement: "To find the force applied by the relay to its contact Equation 11 can be used if $d$ represents the displacement beyond the fixed relay contact surface that the contacting surface of the movable relay contact would experience if the fixed relay contact offered no obstruction." Thus it is that piezoelectricians were taught that contact pressure in a multimorph relay is a function of the degree of displacement of the bimorph that is prevented by engagement of the contacts. That indicates that an unyielding fixed contact is best because that would result in greatest contact pressure.

I have found that a multimorph will bend in response to mechanical pressure, that a potential is developed across the piezoelectric elements as an incident to that bending, and incidently, that greater bending without breakage is possible if that potential is discharged through a load.

I have discovered that contact pressure is increased if the "fixed" contact of Mason is resiliently mounted so that it can yield and permit greater multimorph bending. The reason is that when Mason's multimorph presses against the fixed contact, the contact presses back with equal and opposite force. That mechanical force pressing back developes an electric potential in the piezoelectric elements the magnitude of which increases with pressure and the polarity of which is opposite to the electric potential that causes the multimorph to bend. The result is that the effective potential across the piezoelectric element is diminished. Mason's Equation 11 defines the result — less displacement. Neglecting hysteresis, the piezoelectric effect is reversible. If a given voltage produces a given resultant bending, that much bending, mechanically induced, produces the given voltage. If the fixed contact is not movable, then beginning at the instant of contact, the counter voltage is proportional to the force of multimorph engagement. The counter voltage builds up to equal that portion of applied multimorph voltage that would have produced Mason's displacement $d$. The result is a contact pressure that differs from zero only by the hysteresis difference between cause and reaction.

If a resiliently mounted "fixed" contact is used, or, if the connection from multimorph to either contact is resilient, a different result is obtained. As the contact mount or "resilient contact" bends, some energy is stored in the resilient structure. The fixed contact being resiliently mounted cannot push back with equal force immediately upon making contact. The multimorph must move its contact through part of distance $d$, say through distance $x$ before the reactive force in the resilient contact equals the multimorph bending force. The actual contact pressure is measured by the voltage (gradient) required to move the multimorph through distance $x$. Increased contact pressure minimizes arcing, intermittant failure, permits a wiping action, and in most constructions, it increases contact area. To provide resilient mounting of relay and switch contacts in multimorph relays is another object of the invention. In this connection, it should be noted that what is required is a resilient interaction between the multimorph and the contacts. That can also be achieved by fixed mounting of the contacts and resilient mounting of the multimorph. Consequently, the terms "resilient mounting" and the like are intended to denote relative resilience or resilient interaction, whether it be the contacts or the multimorph that is resiliently mounted.

A major attribute of a bimorph relay is that it uses very little power whereby heat dissipation problems are minimized. While it can serve as a substitute for a conventional magnetically actuated relay, as a high voltage and low current device it has applications that magnetic relays cannot satisfy. To illustrate that point, a bimorph relay may be incorporated in a switch controlled circuit for the purpose of introducing a time delay in completing or disconnecting a circuit without undue use of power or, more importantly, without undue production of heat notwithstanding that the relay must remain actuated for extended periods. In fact, producing a superior relay and relay circuit for accomplishing time delay switching is one of the particular objects of the invention.

Bending in a bar or strip of piezoelectric material is the result of subjecting the bar to an electrostatic field such that there is a potential gradient developed across the bar in the dimension in which it is to bend. One arrangement involves placing the bar or strip in an air space or gas filled space, separating two plates across which a potential is applied so the field extends through the bar. A more efficient structure would place the plates in direct contact with opposite faces of the bar or strip and, in that case, the plates would be formed of easily bent conductive foil or conductive paint. In addition to the bending that results because of an internal potential gradient, added force to bend, or to oppose bending, can be applied by placing the bimorph so that it is subjected to electrostatic attraction. While different embodiments of the invention use different ones of these several forces and use them in different ways, the invention utilizes these several forces to overcome the deficiencies that plagued early exploitation attempts. These several forces can be separately developed. They need not necessarily be applied simultaneously and switch operation resulting from the application of some force can be used to alter the state of the electrostatic field to achieve different compensating effects. To utilize electrostatic fields to compensate for sag and other mechanical effects is another object of the invention.

A major advantage of the piezoelectric relay is that it uses only a small fraction of the power required to operate and maintain electromagnetic relays. Power ratios in the order of one to 100,000 are easily achieved in practice. Its micropower requirement suggests association with solid state controller devices, such, for example, as the complimentary metal oxide semiconductor — CMOS. That is not simply a matter of substitution, however. Multimorph bending is a function of potential gradient. Earlier piezoelectric relays employed potentials in the order of hundreds of volts whereas the potentials required in semiconductor electronics are in units and tens of volts. An object of the invention is to provide a piezoelectric relay and a low voltage, low power semiconductor relay circuit therefor which are compatible and effective. That object is realized in part by improvements in relay construction and biasing circuit techniques.

While the equations that describe multimorph and switch action indicate that use of a resiliently mounted contact provides a special result, those equations suggest no advantage in use of a resilient mounting on the multimorph rather than on the base. Thus, the fact that there is special advantage in associating the resilient contact with the multimorph provides an unexpected result. To provide multimorph switches in which the movable contact is mounted on the bimorph with a resilient mount is another object of the invention.

Another object is to provide a multimorph switch in which the multimorph exerts greater contact pressure than was possible in prior multimorph designs, even when fitted with resiliently mounted contacts. That is accomplished by using a multimorph of increased width together with means for inhibiting bending of the multimorph in the direction of its width. Whereas a conventional multimorph has its layers oppositely polarized in the direction of its longest dimension so that it will bend in the direction of its length, that desirable bending is accompanied by a bending in a perpendicular direction across the width of the element. It appears that the bending is such that the multimorph tends toward a spherical shape. The effect of the crosswise bending across the width appears to be to impede lengthwise bending. However, I have discovered that lengthwise bending is increased if crosswise bending is substantially prevented. The result is greater bending displacement for a given element length and an increase in contact force proportional to increase in width. Increased bending requires a width of one-fourth or more of the length together with a means for substantially preventing crosswise bending.

Various other objects and advantages of the invention will hereinafter appear upon examination of the following specification and of the accompanying drawings.

In practical bimorph relays, the conductive layer, and even the piezoelectric layers, are very thin relative to the length of the element and to dimensions of the frame portions of the unit. In view of this difficulty, the several embodiments have been shown schematically and the thickness of the several layers of the bimorphs have been greatly exaggerated to facilitate understanding of the basic construction and operation of the unit.

FIGS. 3, 4 and 5 are pictorial views of alternative forms of bimorph elements useful in the invention;

FIG. 6 is a schematic diagram of one form of delay circuit embodying the invention;

FIG. 7 is a diagram of an alternative form of time delay circuit embodying the invention;

FIG. 8 is a schematic diagram of another form of time delay circuit;

FIG. 9 is a schematic drawing of another form of multimorph relay and control circuit;

FIG. 10 is a schematic drawing of still another form of relay and control circuit;

FIG. 11 is a cross-sectional view taken on line 11—11 of FIG. 10;

FIG. 12 is a schematic diagram of another multimorph circuit;

FIG. 13 is a pictorial diagram of a specially formed multimorph;

FIG. 14 is an isometric view of a multimorph which is bent in the direction of its length and width;

FIG. 15 is an isometric view of the multimorph of FIG. 14 to which a stiffening member has been added;

FIG. 16 is an isometric view of an alternative form of multimorph switch;

FIG. 17 is a view in side elevation of the switch of FIG. 16;

FIG. 18 is a view in end elevation of the switch of FIG. 16; and

FIG. 19 is a view of another alternative form of switch.

Figure 1:
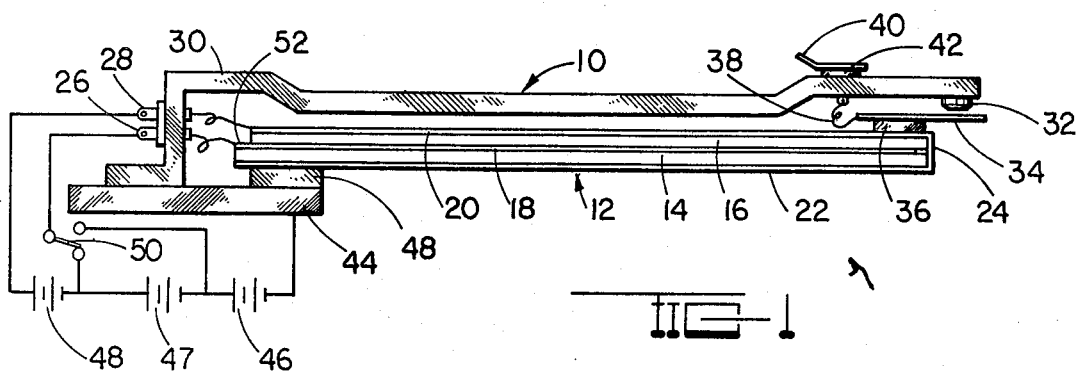
FIG. 1 is a schematic drawing of a single multimorph relay embodying the invention.

The relay of FIG. 1 is generally designated 10. It is intended for horizontal mounting in the fashion shown. The multimorph 12 is actually a bimorph of the kind that employs two piezoelectric bars or strips. It consists of two piezoelectric layers 14 and 16 which are separated by a layer of conductive foil 18. The upper face of piezoelectric bar 16 is painted with a conductive layer 20 and the lower face of piezoelectric bar 14 is painted with a conductive layer 22. The center conductive layer 18 ends short of the outer end of the bimorph to insure that it does not make electrical connection with the end conductive layer 24 which joins the conductive layers 20 and 22. The center conductive layer is connected to a terminal 26 and the outer conductive layers 20 and 22 are connected to a terminal 28. These terminals are mounted on a frame member 30 which carries a fixed contact 32 at its outer end. That contact cooperates with a movable contact 34 which is formed at the end of a resilient arm. The arm is mounted at the end of the bimorph 12 and is movable with it. The arm of contact 34 is secured to the bimorph by a layer of non-conductive cement 36. A fine wire 38 electrically connects the movable electrode 34 to a terminal 40 which is carried on frame member 30 and is insulated from it by a feed-through insulator 42. The frame member 30 is electrically conductive and it is connected, as by welding, to a conductive base 44. In this special case, contact 32 is connected electrically to frame 30. Generally, it would be insulated from the frame and a lead wire from the contact would be added.

Power for operation of the unit is supplied by a DC source represented by three batteries 46, 47 and 48. These batteries are connected in series from terminal 28 to the base 44. No current flows in this circuit after initial connection because the conductive layers 20 and 22 of the bimorph are electrically insulated from the base. The bimorph is cemented to the top of an insulating spacer 48 whose lower face is cemented to base 44. The resistance of the insulator 48 is sufficient so that no current flows in that circuit after the elements are initially charged. The frame member 30 is connected through base 44 to the negative side of the battery combination whereas the electrically conductive layers 20 and 22 are connected through terminal 28 to the positive side of the battery. Consequently, those conductive layers 20 and 22 form one plate of a capacitor whose other plate is the frame member 30. An electrostatic field is developed between the plates of that capacitor and, as a consequence, there is a force of electrostatic attraction urging them together. The frame member 30 is sufficiently rigid so that it does not bend in measurable degree. However, the bimorph is capable of bending. The strength of the electrostatic field is not sufficient to cause an appreciable upward bending of the bimorph, but it is enough to overcome the tendency of the bimorph to sag under the influence of gravity at least in part. The size of the bimorph is exaggerated as explained above and the force of attraction across the field approaches the gravitational force.

The center conductive layer 18 of the bimorph is connected to terminal 26 and then, through single pole, double throw switch 50, to the negative side of battery 48. The small potential of this battery is applied across both bimorph elements and a slight upward bend results. Thus, this potential applies a small bias to set the initial separation of the contacts. When switch 50 is thrown the combined potential of battery 48 and battery 47 is applied across the piezoelectric elements of the bimorph and full bending to contact closure results.

The two piezoelectric elements are arranged back-to-back and they bend in the direction that is determined by the direction of the electrostatic field. To prevent their opposing one another, one of the piezoelectric elements is inverted so that its crystal orientation is opposite the other. The result is a parallel-type bimorph. The two elements thus tend to bend in the same direction as the result of application of a potential difference across the conductive plates. In this case, the two piezoelectric elements are oriented so that the bimorph bends up when the batteries have the polarity shown. When switch 50 is thrown to connect both of batteries 47 and 48 in circuit, full "excitation" is said to have been applied to the bimorph. It bends upwardly carrying movable contact 34 into engagement with the fixed contact 32. Although the movement is small, the spacing between the bimorph and the frame member 30 is diminished so that the potential gradient across them is increased and the electrostatic attractive force is increased. That attractive force now serves as a "sealing" force helping to maintain the contacts in closed condition. Because the end of the bimorph and the contact move in an arc and because the contact arm is resilient, a "wiping action" results on closure.

Figure 2:
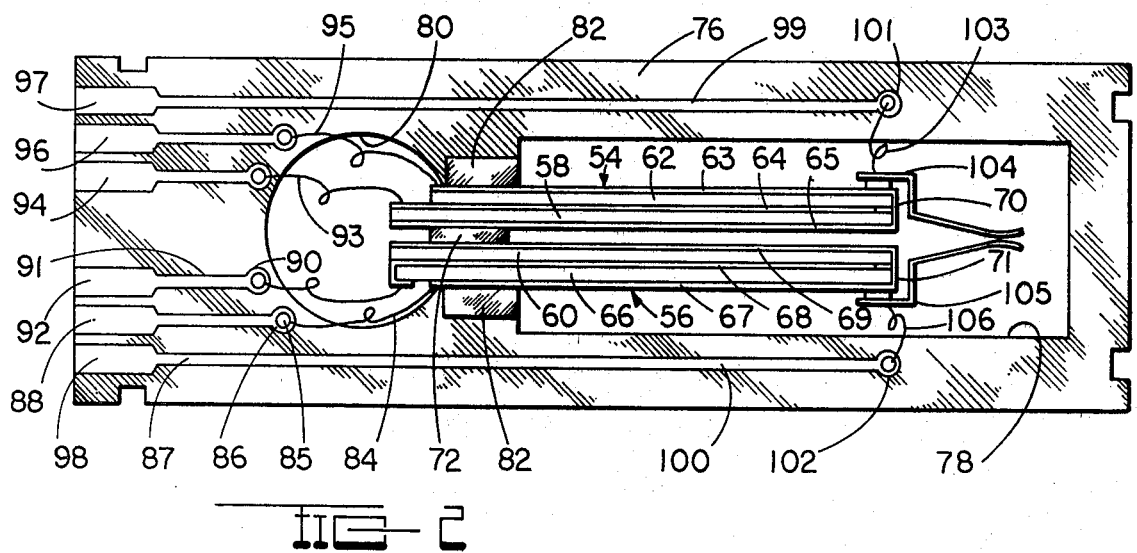
FIG. 2 is a schematic drawing of another form of relay which utilizes two bimorphs.

At the left end of the bimorph, in FIG. 1, the lower piezoelectric element and the conductive layer 18 extend leftward of the upper piezoelectric bar 16. This results in exposure of a portion of the layer 18 at the place identified by the reference numeral 52 so that electrical connection may easily be made to that layer. A similar construction is shown at the left end of the upper bimorph 54 of FIG. 2. The lower bimorph 56 has piezoelectric elements of the same length. The conductive layer on the lower surface ends short of the left end of the unit and the center conductive layer extends around the left edge of the lower face at the left. This arrangement provides a conveniently available surface to which the lead is bonded. Bimorph 54 includes an upper piezoelectric bar or strip 62, an upper conductive layer 63, an intermediate conductive layer 64, a lower piezoelectric strip 58 and a lower conductive layer 65. The other bimorph includes a lower piezoelectric strip or bar 66, a lower conductive layer 67, an intermediate conductive layer 68, an upper piezoelectric strip 60 and an upper conductive layer 69. As in the case of bimorph 12 of FIG. 1, both of the bimorphs of FIG. 2 have an intermediate conductive layer that is slightly shorter at the contact end than the full length of the piezoelectric elements and the upper and lower conductive layers are interconnected by a layer of conductive material that extends over the end of the bimorph. In FIG. 2, layers 63 and 65 are interconnected by a conductive bridge 70 and the outer conductive layers 67 and 69 are interconnected by a conductive bridge 71.

The two bimorphs are clamped together at their left end on opposite sides of an insulating spacer 72 which permits the outer conductive layers of the two bimorphs to be separately enecgized if the switch application requires it. The sandwich formed by the two bimorphs and that spacer is clamped together by the frame 76. In this embodiment, that frame comprises a flat plate of insulating material, a glass filled plastic sheet, which is perforated to form a large rectangular cutout bounded by the sides 78 at the right end of the plate. A generally circular cutout 80 is formed toward the left end of the plate. A section of the plate between them is cut away and the margins of that connecting cutaway bear against the opposite sides of the sandwich formed by the two bimorphs and spacer 72.

In the completed switch, plate 76 is about one inch wide. Spacer 72 is about one thirty-second of an inch thick and the two bimorphs are about one-sixteenth of an inch wide where "width" means the dimension seen vertically in the drawing. Plate 76 is about three thirty-seconds of an inch thick whereas the bimorphs are slightly more than one-eighth of an inch thick. In view of that disparity, the plate is made thicker adjacent to the bimorph sandwich by the addition on each side of the sandwich of a layer 82 of insulating material. Thus supplemented, that portion of the frame that engages the left end of the bimorph sandwich serves as a C-clamping member. The sides of the base plate are spread very slightly and the bimorph sandwich is spring clamped or cemented in place. The sides of the plate are released so that a compressive force is applied to the sandwich. The left end of the bimorph extends into the circular opening 80 where electrical connections are fixed to the several conducting layers by conventional wire bonding techniques. The several wires are connected to respectively associated pins that are inserted in the base. Each of the pins is located at a printed circuit pad and printed circuit runs connect the several pads to terminal pads at the left edge of the board. For example, a wire 84 connects the conductive layers 67 and 69 of bimorph 56 to a pin 85 which is inserted through a pad 86 which is connected by a circuit run to a connector pad 88. A wire connects the conductive layer 68 to a terminal 90 which is connected by circuit run 91 by a pad 92. A conductor 93 connects the center conductive layer of bimorph 54 to a pin pad circuit run and terminal pad combination 94. The two outer layers, 63 and 65 of bimorph 54 are connected by a conductor 95 to the pin, pin pad, circuit run, and connector pad combination 96. An upper circuit pad 97 and a lower circuit pad 98 are connected by circuit runs 99 and 100, respectively, to upper and lower pin and pin pad combination 101 and 102, respectively. Combination 101 is connected by a conductor 103 to a contact and its resilient contact arm 104 which is connected by a non-conductive layer of epoxy to the end of bimorph 54 at its outer side. A similar contact, 105, is secured by layer of electrically non-conductive epoxy to the outer end of bimorph 56. That contact is connected by a wire 106 to the pad and pin combination 102.

In this embodiment, contacts at the ends of resilient contact arms 104 and 105 are normally closed as they are shown to be in FIG. 2. Upon being energized by a source of voltage of proper polarity, the two bimorphs 54 and 56 will bend away from one another carrying the arms 104 and 105 and their contacts apart to open the switch.

The insulating spacer 72 separates the outer conductive layers of the two bimorphs so that they can be given an opposite polarity if it is desired to bias the switch contacts together.

Figure 3:
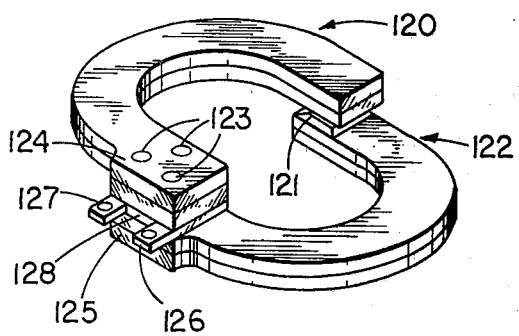
Figure 4:
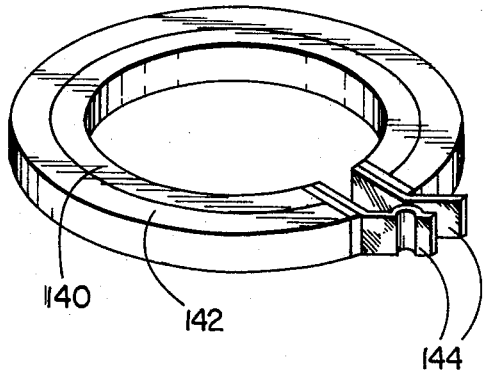

A number of piezoelectric materials are available that can be cast into a variety of shapes. They exhibit piezoelectric properties when fired so that they become ceramics. The newer ceramics bend more and are more stable than the older materials quartz and Rochelle salt. But the ceramic materials provide a difference in kind as well as an improvement in degree. The fact that they can be molded means that the limitation to rod shape has been overcome. A circular from like that shown in FIGS. 3, 4 and 5 is particularly advantageous. The degree of bending is proportional to bimorph length squared so the circular shape provides high bending to switch dimension efficiency. Moreover, the circular or part circular shape makes improved switch contact arrangements available.

The units of FIGS. 1 and 2 employ fixed contacts that are mounted on the bimorph by a resilient support member. That construction provides unexpected advantage. The use of resiliently mounted contacts was found to be necessary in the electromagnetic switch art because of the need to have the armature of the actuating structure move through the air gap into sealing engagement with the magnetic structure. That presented a dimensional problem because the movable and fixed contacts had to be placed so that they would engage one another with the requisite contact pressure when the armature was sealed against the magnet. To overcome the problem of dimensional variation in manufacturing, it was necessary to employ a resilient contact mounting structure. The multimorph switch was thought to overcome the need for resilient contact mounting. The equation and explanation presented by Professor Pierce indicates that a multimorph can develop the requisite contact pressure required in a switch simply by increasing the strength of the electrostatic field beyond the strength required to bend the bimorph in a degree sufficient to bring the fixed and movable contacts of the switch into engagement. That conclusion was a very important one. It indicated that one could make the switch with adequate contact pressure by doing no more than increasing the field strength to which the bimorph was subjected. That meant that there was no need to resort to the resilient contacts that switch makers had been forced to adopt for electromagnetic switches and relays.

However, in practice, piezoelectric switches constructed according to Professor Pierce's teachings develop a contact pressure limited by the amount of hysteresis exhibited by the multimorph responding to the application and the termination of an electrostatic field. That is because the piezoelectric effect is reversible. While the application of an electrostatic field produces bending, a mechanical force sufficient to produce bending produces an electrostatic field. That phenomenon is not taken into account in Professor Pierce's work. Applicant has discovered that if the counter force of the fixed contact is stored in a spring instead of being permitted to produce counter bending in the multimorph, then a contact pressure will be developed which is substantially equal to the amount of force that is stored in the spring. If the movable contact is mounted on the multimorph with a spring or resilient mounting structure, the fixed contact need not be resiliently mounted and can be fixed directly to the switch frame. Further, by mounting the movable contact on the multimorph with a resilient element, dual bimorph switches, such as the switch shown in FIG. 2, become possible and practical.

In FIG. 3, the two bimorph elements 120 and 122 are mounted in parallel plane. Each has the form of a "C." One extends clockwise and the other extends counter-clockwise and their ends overlap so that in top plan view they would have a form that looks circular or oval shaped. The two units are alike in that both of them are molded so that they have a raised contact area on one side at one end of the C-shape. The raised portion 121 of bimorph 122 is visible. It extends upwardly toward a similar contact area formed on the lower surface of the bimorph 120. At the other end of the C-shape, both bimorphs are made wider and the wide portion is provided with three perforations 123 which accommodate fasteners whose purpose is to secure them together, to act as electrical conductors, and to serve as a means by which the two bimorphs can be assembled to a fixed base. The wide portion of the upper bimorph 120 is designated by the numeral 124 whereas the corresponding wide portion of the lower bimorph 122 is designated 125. The conductive layers of the two bimorphs are arranged so that electrical connection can be made to them through the fastening elements that extend through the holes 123. This is true except in the case of the conductive layer on the upper face of bimorph 122 and the conductive layer on the lower face of bimorph 120. These two conductive layers cover contact area 121 and the corresponding contact area on the lower face of unit 120, respectively. The two conductive layers extend over the contact area, and completely around the C-shape, to the juxtaposed surfaces of the two bimorphs. A connector plate or shim 126 is placed atop the conductive layer at the top of biomorph 122. A similar connecting plate or shim 127 is placed adjacent to the conductive layer at the lower face of bimorph 120. These two plates are provided with ears which extend sidewardly from the unit to serve as connection points for external circuitry. The two connector plates or shims are separated by an insulator 128. When excited, the two bimorphs bend toward one another until their contacts touch to complete an electrical circuit from connector plate 126 to connector plate 127. When that excitation is removed, the two bimorphs bend back to an initial position in which their contacts are separated and the circuit between connector plate 126 and 127 is opened. This then is an example in which the conductive layers that permit energizing the bimorphs are made to serve as the conducting leads to the switch contacts. The elements are longer at their outer periphery and bend more at the outer side. The elements twist as they bend so a kind of wiping action results.

The unit of FIG. 4 is constructed so that the two piezolelectric layers 140 and 142 are disposed one inside the other. Like the others, it has a central conductive layer and two outer conductive layers. When those layers are energized, the spacing between the ends of the C is altered. Contacts 144, which are cemented with an insulating plastic cement to the ends of the C-shape, are moved apart or brought together according to the polarity and degree of energization of the conductive layers.

FIG. 5 shows a helical spiral having slightly more than one complete turn. There is no reason why more turns could not be added to increase element length if a proper mold was made. Only the bimorph 130 is shown in FIG. 5. It includes an upper layer 132 and a lower layer 134. They are separated by a conductive foil layer 136. One end 138 of the unit is enlarged toward the axis of the spiral and it is formed with openings for fasteners. In this particular unit, one switch contact of the switch will be fixed by those same fasteners to the enlarged or base end 138. A movable contact will be fixed to the other end 135.

FIG. 6 shows an application of a bimorph relay 150 to a timing circuit. The problem is to energize load 152 from AC source 154 such that the load is energized immediately upon closure of the main switch 156 and such that the load remains energized for some period of time after switch 156 is opened. There are a number of applications for such a system. For example, whereas in a conventional room lighting system, the light is extinguished as soon as the "light switch" is open, it might be preferable to have the light persist for a time after the light switch is actuated so that the room is not thrown into darkness until after one leaving the room has had time to exit. In the circuit of FIG. 6, the load 152 is energized immediately when the switch 156 is closed, but energization persists for a short period of time after the switch 156 is opened. Closure of that main switch completes a circuit to the conductive layers of a bimorph 158 through the series combination of a resistor 160 and a rectifier 162. A delay resistor 169 is connected in series in parallel with the series combination of bimorph 158 and resistor 160.

When switch 156 is closed, unidirectional energy is applied to bimorph 158 and some of that energy is stored in the dielectric material of the bimorph. As a consequence, the bimorph elements bend and actuate switch 167. The latter is closed to complete the circuit to the load 152. The switch 167 remains closed until the energy in the bimorph has been dissipated. When switch 156 is open, the energy in the bimorph begins to dissipate as current flow proceeds from the bimorph through resistor 166 and resistor 160 back to the bimorph. When the energy in the bimorph has been dissipated sufficiently, the switch 167 will open and the load 152 will be de-energized. This circuit is quite simple. It has several advantages over magnetic and mechanical timing systems.

The circuit shown in FIG. 7 is even more advantageous. This system includes two special electronic switches, one involving the combination in a package of counter conducting rectifiers. This device 170 is available under the trade name "Triac." A silicon controlled rectifier set will also suffice. The system also uses a pair of back-to-back diodes. These units can be supplied separately but are advantageously combined in a single package and are available in that form under the trade name "Diac." That unit is the one shown in FIG. 7 where it is designated by the reference numeral 172. It is to be understood that the circuit will work equally well if a silicon controlled rectifier is substituted for the device 170 and a pair of inversely connected diodes are substituted for the device 172 in a circuit configured to account properly for polarity.

The load 174 is connected in series circuit with an alternating current source 176 and the device 170 either in the position shown or, in some applications, in line 178 between the junctions to switches 200 and 188. One of the conductors from the device 170 to the load is designated 178. The other, the one that extends oppositely from device 170, is designated 180. Device 170 has a firing electrode and that electrode is connected to one side of device 172. A pair of capacitors 182 and 184 are connected from opposite sides of device 172 to a common connection at line 180. Firing voltage is connected to that electrode, 186, through the device 172 from line 178 through the switch 188 of the bimorph relay 190. The connection proceeds from line 178 through switch 188 and rheostat 192 and a resistor 194 to the device 172. The bimorph of the relay is energized by a circuit which extends from line 178 through a main switch 200 and a rectifier 202 to the center conductor of the bimorph 204. The outer conductors of the bimorph are connected to conductor 180. A discharge resistor 206 connects from the center conductor of the bimorph 204 to line 180.

When the main switch 200 is closed, rectified, unidirectional current flows through the switch and rectifier 202 to the parallel combination of resistor 206 and the bimorph. A unidirectional voltage appears across resistor 206 and that voltage is impressed across the piezoelectric elements of the bimorph 204. As a consequence, the bimorph bends and closes the contacts of its switch 188. Thereupon, current is permitted to flow from line 178 through switch 188 and resistor 192 and 194 to device 172 of its capacitors. This device permits the capacitors to charge at a rate determined by their value and the value of resistors 192 and 194. When charged to the predetermined voltage level, the device 170 fires and current is permitted to flow to the load for the remaining portion of that half cycle of supply wave alternation until the polarity of the supply is reversed and flow ceases. Adjustment of rheostat 192 alters the charging time of the capacitors whereby the time of firing during each cycle can be altered and the amount of current flowing to the load can be changed. This function is called "dimming." When the switch 200 is opened, the energy stored in the piezoelectric elements of bimorph 204 is permitted to dissipate through the time delay resistor 206. When the energy in the field has been diminished to some lower value, switch 188 is opened and firing voltage is no longer applied to trigger electrode 186. Thus, this is a dimming circuit in which turn-off is delayed after opening of the main switch by limiting the discharge of the bimorph element through the time delay resistor 206.

A simplified time delay arrangement is shown in FIG. 8. It employs a single pole-double throw switch 210 whose pole is connected to the base of a transistor 211 whose collector is connected to a positive line 212 through a resistor 214. The emitter of transistor 211 is connected to negative ground. Switch 210 is arranged so that the base can be connected to the positive line or to ground as desired. The collector of the transistor is connected to ground through a diode 215 in series with the parallel combination of a multimorph 216 and a discharge resistor 217. When the transistor 210 is non-conductive, the multimorph chart is charged and bends. When the transistor is rendered conductive by connection of its base to the positive line, its collector potential is lowered to near ground potential. The multimorph 216 then discharges through resistor 217 at a rate determined by the time constant of the multimorph and the resistor. The diode 215 serves not as a rectifier but rather as an isolating element that permits charging current to flow to the multimorph from the transistor circuit while confining discharge current to the discharge resistor 217.

Another form of relay is illustrated in FIG. 9. The element 220 there shown includes two concentrically arranged biomorphs 222 and 224. They are coplanar and are arranged so that they will bend in that common plane toward and away from one another as an incident to charging and discharging of the bimorphs. At one end the two bimorphs are mounted resiliently in an elastomeric base 226. That base is capable of holding the bimorphs semi-rigidly in the position they are shown to occupy in FIG. 9. However, there is a sufficient amount of resilience in that base to permit a small amount of relative movement of the bimorphs at that end when the contacts at the opposite end are closed and bear against the bridging element 228. A contact 230 is mounted on, and insulated from, the free end of the bimorph 222. A similar contact is mounted upon, and insulated from, the free end of bimorph 224. That second contact is identified by the numeral 232. When the bimorphs are energized their free ends move toward one another carrying contacts 230 and 232 into engagement with the bridging element 238. Element 238 is a conductive bridge carried on the non-conductive resilient base 226.

The bimorphs and the base are housed within a neon gas filled, metal walled container. Its walls are electrically conductive and they are concentric with the bimorph elements. The outer wall 240 is spaced only a short distance from the outer surface of bimorph 224 and the inner wall 242 is spaced only a short distance from the inner wall of bimorph 224. A number of connections are provided to the several elements of the unit. Lead 244 connects to the metallic coating on the sides of bimorph 222. Lead 246 connects to the center conductive layer of that bimorph. Lead 248 connects to the outer and inner conductive surface of bimorph 224; and lead 250 connects to the center metallic layer of that bimorph. Lead 252 connects to the inner conductive wall of the container and lead 254 connects to the outer conductive wall of the container.

This arrangement permits applying potentials to the inner and outer wall of the case to create electrostatic fields between the walls and the metallic outer walls of the bimorphs whereby to create forces which will aid or oppose the movement of the bimorph elements.

In FIG. 9, the two bimorphs are oppositely oriented so that when they are charged in the same fashion, both of them bend in a direction to carry their respectively associated terminals 230 and 232 toward the bridging block 228. In view of that, lines 244 and 248 are interconnected and lines 246 and 250 interconnected. The metallic container walls 242 and 240 are also interconnected. The two walls 240 and 242 are connected to one terminal of a variable DC source 241 and the outer conductors of both of the bimorphs are connected by lines 244 and 248 to the other terminal of the variable DC source. A voltage divider connected across the source terminals has its intermediate point connected to the outer conductive strips of the two bimorphs by way of conductors 244 and 248. If it is assumed that the variable DC voltage is increased, the potential difference between the case and the outer conductor of the bimorphs will increase. At some voltage level prior to closure of contacts 230 and 232, the neon gas between the outer conductor and the walls 240 and 242 will break down whereby a low resistance path will have been formed effectively short circuiting part of the voltage divider so that substantially all of the voltage of the variable source is applied across the bimorph elements. In this arrangement, the activating voltage is applied to the bimorph suddenly notwithstanding that the source is variable and contact closure is rapid. As an added advantage, the glow of the neon within the unit serves, when the housing is transparent, as a visual indicator that the switch has been activated.

FIG. 10 shows two bimorph elements 300 and 302 which are similar to those previously described in that they are formed with a conductive layer on their upper and lower sides that extends over one end of the bimorph so that the two sides are interconnected and are at the same electrical potential. The cross-sectional drawing of FIG. 10 illustrates that the conductive layers extend over the top and bottom of the bimorph, and in a layer along its center plane, but that there is no conductive layer at the other two sides of the element. They are protected, as best shown in FIG. 10, by an insulating coating 309. For identification, the upper, conductive layer in FIG. 10 is designated 304 and the lower conductive layer is 306 and the center layer is 308. The construction of bimorph 300 is similar.

Near their outer ends, the bimorphs are fitted with contact sets which are insulated from the conductive layers. In the case of bimorph 300, a contact 310 having a resilient shank is affixed to, but insulated from, the bimorph's outer conductive layer. At the lower surface of the bimorph, a second contact 312 is connected by its resilient mounting stem to the lower side of the bimorph 300. Another contact 314 is arranged to cooperate with contact 312 and is connected by a flexible connecting stem to the outer conductive layer of bimorph 302 although it is insulated from that layer. Another contact 316 is mounted by its resilient stem to an insulating block 318 which is carried by the outer side of the bimorph 302.

Contacts 312 and 314 cooperate with one another and are shown to be normally closed when the bimorph elements 300 and 302 are in relaxed state. Contact 310 cooperates with a fixed but resiliently mounted contact 320. Contact 316 cooperates with another fixed but resiliently mounted contact 322. Both the fixed contact structures and the bimorphs are connected to a base cup 330 which is formed of an electrically non-conductive material.

Energization, and therefore the bending, of the bimorphs is powered by a unidirectional electrical power source 332. The two bimorphs are energized in parallel so that the full voltage of the source is applied to the bimorphs except to the extent that the energizing voltage is modified by the control circuitry. That same source 232 supplies power to the load which in this case is represented by resistor 334. That load is in series with the contacts that are operated by the bimorphs. The circuit is traced as follows: The negative side of source 332 and the fixed contact 320 are at ground potential. When the bimorphs have bent sufficiently to bring movable contact 310 into engagement with fixed contact 320 and to bring movable contact 316 into engagement with fixed contact 322, a circuit will have been completed from the positive side of source 332 by line 338 through the load 334 to fixed contact 322 and thence to contact 316 to the bridging connector 340 to contact 310 and ultimately to ground at fixed contact 320. Thus, while the bimorphs are energized from the source in parallel, the contacts that they control are connected in series so that only half of the voltage drop of the source appears across each of the two sets of contacts. This feature is important because it makes it possible to minimize the electric field gradient between the fixed and movable contacts as the contacts are moving to closed position whereby arcing is minimized.

The outer conductive layers of the two bimorphs are interconnected by a bridging line 334 and that line is connected to the negative side of source 332 and to ground by a line 346. The center conductive layers of the two bimorphs are interconnected by a bridging line 348 and they are connected by a line 350 to the output terminal 352 of a complementary metal oxide semiconductor or CMOS amplifier 354. The amplifier is powered from the source by connection to lines 338 and 346. The input signal to the CMOS unit is applied by an operational amplifier 356 connected as an adder. Potentiometer 358 is connected across the source 332. Its movable tap is connected as one of the inputs to the operational adder 356. The input of that adder is also connected to a point 360 in a voltage divider that comprises a fixed resistor 362 and a variable, photo-sensitive resistor 364. As the value of the resistor 364 varies, the voltage at point 360 will vary so that the output from adder 356 will depend upon the setting of the bias potentiometer and upon the degree of light that impinges upon the resistor 364. The output of the adder is applied to the CMOS unit 354 and its output is applied across resistor 370. THe voltage across resistor 370 is the voltage that is applied to the bimorphs 300 and 302.

This circuit arrangement illustrates several very important features of the invention. CMOS devices, such as the device 354, are very low-powered units. Their power handling capacity is far less than what is required to activate the smallest electromagnetic relay. However, this piezoelectric relay requires so little power that the use of a CMOS device to actuate the relay is feasible. That fact makes it possible to use the piezoelectric relay in applications that were not practical before. In FIG. 10, a lamp 372 is included by which to illuminate the photo-sensitive resistor 364. In the drawing, the member 374 represents part of a punched card in which a hole has been punched. Light flowing through that hole to the sensor 364 effects the resistor 364. The result is an improved, ultra low powered, arrangement for detecting whether or not a punched card does or does not have a hole and for operating a relay in accordance with that information. Adjustment of the position of the tap on bias potentiometer 358 permits the application of a bias voltage to the bimorphs. Application of a biasing voltage permits control of initial bimorph bending. Thus it permits electrical adjustment of the initial spacing of the relay contacts.

The circuit of FIG. 10 includes another feature that has been incorporated to illustrate the advantage of the piezoelectric relay when coupled with the CMOS unit. Very little input power is required for operation of the CMOS unit 354. It can be controlled by an exceedingly small current such as would flow through a high resistance control circuit. In FIG. 9, the CMOS unit can be made to activate the relay when an operator's finger 380 is applied to the pair of terminals 382 in the input circuit of the CMOS. In this case, the terminals 382 are connected to the CMOS input by lines 338 and 384. The finger 380 touching the terminals 382, is approximately equivalent to connecting of the CMOS input unit to the positive supply terminal through a 10,000 ohm resistor. By that arrangement, a very small current is applied to the CMOS input.

The dashed line 390 around the relay in FIG. 10 represents that it is housed in a neon gas filled, sealed container.

The arrangement in FIG. 10 implies, and it is true, that the capacitance exhibited by a bimorph element is very small. That means that the electrical charge required is very small. This is illustrated in FIG. 12 where battery 400 is connected in series with a light sensitive resistor 406 across the parallel combination of a bimorph element 404 and a pair of contacts 402. The light sensitive resistor 406 is one of the class of elements whose resistance changes with the intensity of light that impinges upon it. While a general symbol is used, device 406 could be one of the light sensitive semiconductor devices. In any event, the one represented in FIG. 12 is arranged so that at one light level its resistance is lowered sufficiently to permit charging current to flow to the multimorph 404 sufficiently to cause it to bend and actuate switch 408 to which it is connected mechanically. Once the bimorph is charged and bent any change in the resistance of device 406 will be effective to discharge the bimorph and it will remain bent and the switch 408 will remain actuated until the bimorph is discharged. It can be discharged by connecting a resistor across contacts 402 and that can be done simply by pressing a finger across those contacts. The resistance of a finger is ordinarily relatively high, but the amount of current that must be dissipated from the bimorph is sufficiently small so that merely pressing a finger against contacts 402 will be sufficient to discharge the bimorph and reactivate the switch 408. The position of the contacts 402 and of the light sensitive resistor 406 may be interchanged to invert the function of the circuit. In that case, a finger would be placed against the contacts to initiate switch action and light change would be effective to return the switch to original condition.

The structure shown in FIG. 13 is a multimorph, in this case a bimorph, which is specially constructed to provide an increase in degree of bending when energized. The degree in which a cantilever type multimorph bends is a function of the ratio of the length squared to the thickness squared where length refers to cantilever length and thickness refers to the dimension of the multimorph in the plane and in the direction in which it bends. The degree of bending is also dependent upon some co-efficient term whose value is determined by the material of the bimorph. Ceramic piezoloelectric materials provide the highest degree of bending. However, the amount of bending is small in the best of materials so there is a need to make the multimorph as thin as practicable. Loss of strength limits the amount of thickness reduction that is possible. To some extent, strength can be enhanced by increasing the width of the bimorph, but there are practical limits to the degree in which that expedient can be carried. This invention involves the discovery that the degree of bending fro a given applied voltage can be increased to some extent without proportionate loss of strength if the multimorph, having been made in relatively thin fashion, is scored or sawed or otherwise processed so that its thickness is decreased at discreet points along its length. Two schemes for accomplishing this structural improvement are illustrated in FIG. 13 where the two piezoelectric ceramic strips or bars 500 and 502 are joined in a sandwich which includes an inner conductive layer 504 and outer conductive layers 506 and 508. A conductive layer 506 is formed atop or applied to bar 500 and a conductive layer 508 is applied to the outside of bar 502. The two bars are molded so that one surface is shaped like a sawtooth, or a series of steps, when viewed from the side. The two juxtaposed surfaces of the strips are formed with complimentary arranged steps so that the thick portions of one strip fall within the thinner portions of the other.

By this expedient, the preparation of the bimorph bar with a stepped surface, a bar can be produced whose minimum thickness is less than what is practical in a bar of uniform thickness. An examination of the equation that describes the degree of multimorph bending will reveal that a reduction in bar thickness to a value less than average thickness will permit an increase in bending that is not entirely nullified by a corresponding increase in thickness elsewhere along the length of the bar. That means that the degree of bending will be enhanced by the sawtooth arrangement even though the average thickness of the bar is not changed.

This effect is supplemented in the structure shown in FIG. 13 by a series of saw cuts or grooves made transversely across the bar perpendicular to the direction to which the bimorph is to bend. In FIG. 13, three saw cuts identified by the reference numeral 510 are shown to have been formed in the upper surface of piezoelectric bar 500. Three saw cuts 512 have been made in the outer surface of the other bar 502. Inclusion of those saw cuts greatly enhances the degree in which the bimorph will bend for a given applied exciting voltage. The unit of FIG. 13 is arranged for mounting at its butt end, generally designated 514, so that its opposite end, the right end in FIG. 13, is the one that will bend. That end carries a contact structure 516. It will be observed that the two piezoelectric strips 500 and 502 are tapered from their butt end to their contact end so that they are thinner at the contact end. The reason for that construction is to provide greater strength toward the butt end and greater bending at the contact end. This construction is adopted to accomplish several purposes. Since the bending is non-uniform along the length of the unit, the contact 516 moves in a path that forms a segment of a spiral whereby the contact 516 will not simply abut, but will tend to wipe against, a fixed contact which it engages during bending. Moreover, the tapered construction permits the development of higher orders of force between the contact carried by the multimorph and the contact with which it engages without fracturing the multimorph structure.

In the relay art, the term "contact" is widely used to designate both the contacting piece per se and the combination of that contacting piece and the lever or arm on which it is carried. In the case of contact 516, that arm is resilient. In fact, that is true in the case of all of the contacts shown in the drawings. It is that characteristic that permits further movement of the bimorph after initial contact. That further movement produces two effects. It permits development of sealing pressure and a small wiping action between contacts. Second, it limits bimorph voltage and charge. The action of the bimorph is reversible, while electric force input produces an electrical output. When the contacts seal the resilient force limits electrical input.

Returning to the matter of time delay, the circuits of FIGS. 6 and 7 are arranged so that a switch or relay is closed immediately upon application of exciting voltage to the multimorph and so that it opens only after some delay following removal of exciting voltage through a delay circuit. That arrangement, while accomplished more efficiently in multimorph relays, can be accomplished using electromagnetic relays. However, the invention is capable of time delay in a different sense, which cannot be reproduced in the electromagnetic relay or switch. There is no discharge path in the circuit of FIG. 1. Once the switch is closed by the application of potential, it cannot be opened. The switch could be removed from the circuit and the potential across its piezoelectric elements would still be there. The element would remain bent and the switch contacts would remain closed. The quality factor, Q, of piezoelectric elements is very high, which means that the ratio of energy stored to internal resistance is very high. In practice, the switch contacts remain closed for two or more days where the contacts are relatively quite resilient. All one need do is to open the multimorph discharge circuit until such time as the switch is to be opened, or until timed opening is to begin. At that time, a load is connected across the multimorph. If that load is a low resistance the switch will open immediately. If the load is a time delay circuit, then the switch will open after its time delay. That makes it possible to separate the multimorph relay, its energizing circuit, and its discharge circuit, and to move them individually from one place to another to provide a whole new range of applications for relays. By way of example, a separate time delay circuit could be used as a key to open a relay after a time delay by discharging the relay bimorph in a security system designed to permit use of the key at any time but only once and for a limited time during that one use.

A structure similar to what is shown in FIG. 13 will exhibit bending beyond the predicted amount if, instead of the usual narrow reed-shaped multimorph that is depicted in the patent literature, the unit is made wider. The apparent reason for that result is that while reductions in the thickness along lines transverse to the length of the unit permit greater lengthwise bending, bending in the transverse direction is impeded by the fact that the unit has greater thickness along other lines transverse to the unit's length. If a multimorph in the form of a plate is subjected to an electrostatic field, it will tend to form a segment of a sphere. If such a multimorph is mounted at one end cantilever-like by a mount 608 shown in FIG. 14, and if the unit is subjected to an electrostatic field, it will bend in both the lengthwise and crosswise dimension. The degree of crosswise bending of such a unit 610 can be limited by cementing a stiffening member 612 crosswise of the unit along its end. Instead of the reaction to the crosswise bending forces appearing as stress in the stiffening member, at least some of the reaction is manifested as increased lengthwise bending as shown in FIG. 15.

A practical version of the device is shown in FIGS. 16, 17 and 18. A multimorph 620 having a width half its length is formed by an upper piezoelectric layer 622 and a lower piezoelectric layer 624. The upper surface of layer 622 is electrically conductive as is the lower surface of layer 624. The two piezoelectric layers are oppositely polarized and they are both bonded to a conductive mid-layer. Those three conductive layers are so thin that no attempt has been made to identify them in the drawing with reference numerals. The lower piezoelectric layer 624 is longer than is the upper layer 622 at the left end of the unit where it is mounted upon a bar of insulating material 626. The lower conductive surface of layer 624 rests atop a conductive metal strip 628 which overlies the insulating bar 626. A narrower bar 630 overlies the upper conductive surface of layer 622. The strip 628 and the bar 630 are connected together so that the upper and lower surface of the unit can be connected to one side of the electrical energy source that supplies the electrostatic field. The other side of that source is connected to the bar 632 which overlies a conductive contact strip 633 which rests on the upper surface of the lower section 624 of the bimorph and makes electrical connection to the conductive layer between the sections 622 and 624.

A number of fastening elements hold that assembly together such that the bimorph extends cantilever-like to the right, in the drawing, from its mounting block 626. The block is secured to a mounting plate 629. The mounting plate underlies substantially all of the bimorph element and it has an insulating strip 634 bonded to its outer end on the upper side of plate 629 where it carries a fixed contact 636 which is engaged by a movable contact 638. The contact structure is best shown in FIGS. 17 and 18. There are two movable contacts. Both are mounted upon a resilient member which in turn is bonded by a non-conductive bonding agent to the lower face of the bimorph element. Contact 636 is mounted upon a resilient contact arm 640 and contact 642 is mounted upon a resilient arm 644. As the bimorph bends downwardly toward the plate 629, the two contacts 642 and 636 are carried downwardly. Ultimately, as the degree of bending increases, the contact 636 engages fixed contact 638. As the bimorph bends in further degree, the contact arm 640 is flexed and the pressure between contacts 636 and 638 is increased. Further downward bending of the bimorph brings contact 642 into engagement with the upper surface of contact 636. As the bimorph bends an even greater degree, the resilient mounting structure 644 begins to bend and pressure between contacts 642 and 636 is increased as is the contact pressure between contact 636 and 638.

The degree of bending of a bimorph increases as the thickness of the bimorph is decreased. In the structure shown in FIG. 13, the thickness of the bimorph varies in the direction of its length. In the preferred construction shown in FIGS. 16, 17 and 18, the bimorph element is uniformly thin. Crosswise bending is prevented, or substantially diminished, by the addition of reinforcing or stiffening elements which extend crosswise of the unit at space points along its length. The under surface of those bars, which are identified by the reference numerals 650, 651, 652, 653 and 654, is bonded to the conductive upper layer of the bimorph element. The size of those stiffening elements is not critical. It is necessary only that they be heavy enough, and that there be sufficient bonding surface, so that they will substantially prevent crosswise bending of the bimorph. It matters not whether they be conductive or nonconductive. However, they should be relatively narrow so that as little impedance is prevented to lengthwise bending as possible.

It is possible to cast bimorphs in a variety of shapes including the shape of the upper and lower layers 660 and 662 of the bimorph 664 of FIG. 19. That bimorph is mounted on a structure designated 666 which is not unlike the mounting structure of the unit shown in FIGS. 16, 17 and 18. Flexure of the bimorph 664 results in bending of the outer end of the unit to carry the movable contact 668 into engagement with the fixed contact 670. As in the other units, the movable contact is affixed to the bimorph by a resilient mounting structure 670.

In the unit of FIG. 19, only one transverse stiffening member 672 is employed and it is integrally formed with the upper layer 660.

In this case, the means for preventing bending in the crosswise direction across the width of the unit is prevented by forming the bimorph layers so that over a portion of their length they extend in a direction which is either perpendicular to the lengthwise dimension in which the unit is to bend or so that they extend in a direction that has a significant component perpendicular to that lengthwise direction. Thus, in FIG. 19, the bimorph layer 660 has sections 660a, 660b, and some others, which lies in a plane crosswise and perpendicular to the length of the bimorph unit. That is true also of sections of the lower layer 662 of the bimorph.

The major advantage of the wide multimorph is that it provides a greater contact pressure. It must be used with resiliently mounted contacts, but when such contacts are used, the force that can be stored in the contact structure appears to be linearly related to multimorph width.

Another of the advantages of the wide multimorph will be apparent by comparing FIGS. 17 and 19. In FIG. 19, the resilient element 670 by which the movable contact 668 is connected to the multimorph is arranged so that it extends from the end of the multimorph in the direction of multimorph bending. That arrangement tends to increase the amount of movable contact displacement. However, it has the disadvantage that it increases the overall length of the unit beyond the length of the multimorph. When the multimorph is increased in width as illustrated in FIGS. 16, 17 and 18, it is possible to mount the resilient members which carry the movable contact so that they extend in the direction transverse to multimorph bending. As shown in FIG. 17, that permits the use of a longer multimorph element in a given switch unit length.

Although I have shown and described certain specific embodiments of my invention, I am fully aware that many modifications thereof are possible. My invention, therefore, is not to be restricted except insofar as is necessitated by the prior art.

I claim:

1. In combination:
   a frame;
   a multimorph of piezoelectric material having a fixed part carried by said frame and a movable part free to flex in a plane of movement upon excitation of the multimorph;
   a pair of electrical contacts, at least one of which is resiliently mounted, movable relative to one another in response to multimorph flexure;
   means for applying an electrical potential to said multimorph in a magnitude sufficient to cause flexure of said multimorph whereby to actuate said contacts;
   means for developing an electric field polarized such that it extends in a direction having a component parallel with the plane of movement of said multimorph and positioned such that a part of said multimorph is subjected to said field whereby flexure of said multimorph as an incident to excitation will be altered by said field;
   said multimorph comprising strips of piezoelectric material, and a layer of conductive material fixed to a side of said strips;
   said means for developing an electric field being effective to form the field such that it terminates at said layers of conductive material; and
   said frame being electrically conductive and said field extending from said frame to said layer of conductive material.

2. In combination:
   a frame;
   a multimorph of piezoelectric material having a fixed part carried by said frame and a movable part free to flex in a plane of movement upon excitation of the multimorph;
   a pair of electrical contacts, at least one of which is resiliently mounted, movable relative to one another in response to multimorph flexure;
   means for applying an electrical potential to said multimorph in a magnitude sufficient to cause flexure of said multimorph whereby to actuate said contacts;
   means for developing an electric field polarized such that it extends in a direction having a component parallel with the plane of movement of said multimorph and positioned such that a part of said multimorph is subjected to said field whereby flexure of said multimorph as an incident to excitation will be altered by said field;
   said multimorph comprising strips of piezoelectric material, and a layer of conductive material fixed to a side of said strips;
   said means for developing an electric field being effective to form the field such that it terminates at said layers of conductive material; and
   said multimorph being disposed in a gaseous atmosphere, the gas comprising one that is rendered conductive when the strength of said field reaches a predetermined value;
   said means for applying an electrical potential from a source to the multimorph being responsive to alter the potential applied to said multimorph when said gas is rendered conductive.

3. The invention defined in claim 2 in which said field extends between said frame and said conductive layer and in which the frame and conductive layer and said multimorph are connected in circuit to said means for applying an electrical potential to said multimorph; and which comprises means incorporated in said circuit for increasing the potential applied to said multimorph when said gas is rendered conductive.

4. In combination:
   a frame;
   a multimorph of piezoelectric material having a fixed part carried by said frame and a movable part free to flex in a plane of movement upon excitation of the multimorph;
   a pair of electrical contacts, at least one of which is resiliently mounted, movable relative to one another in response to multimorph flexure;
   means for applying an electrical potential to said multimorph in a magnitude sufficient to cause flexure of said multimorph whereby to actuate said contacts;
   said means for applying an electrical potential to said multimorph comprising a source of an electrical potential and a CMOS device connected between said source of electrical potential and said multimorph;
   said means for applying an electrical potential to said multimorph further comprising means for controlling conductivity of said CMOS device.

5. The invention defined in claim 4 in which said means for controlling conductivity of said CMOS device comprises a resistive element whose resistance varies as a function of the state of some physical condition.

6. In combination:
   a multimorph of piezoelectric material of a kind which flexes in a plane of movement upon being subjected to an electrical potential;
   a pair of contacts and means for actuating said contacts as an incident to flexure of said piezoelectric multimorph;
   means for applying an electrical potential to said multimorph in a magnitude sufficient to cause flexure thereof whereby to actuate said switch comprising an electrical power source, and a CMOS device connected between the power source and said multimorph, and means for altering the conductivity of said multimorph in response to a condition; and means for applying a biasing potential to said multimorph independently of variations in conductivity of said CMOS device.

7. A multimorph element for exhibiting bending action in a plane, comprising:
a first layer of conductive material, and at least two elongated bars of piezoelectric material arranged back-to-back lengthwise on opposite sides of said layer of conductive material such that the bending plane of the composite extends through the length of both bars;
at least one of said bars having reduced thickness in a region along its length extending across the bar transversely to said plane.

8. The multimorph of claim 7 in which both of said bars are formed with such regions of reduced thickness along their length, said regions extending transversely to said plane.

9. The invention defined in claim 8 in which at least some of said regions of reduced thickness are formed on the respective surfaces of said bars opposite the side adjacent to said conductive layer.

10. In combination:
a frame;
a multimorph of piezo-electric material having a fixed part carried by said frame and a movable part free to flex in a plane of movement upon excitation of the multimorph;
a pair of electrical contacts, at least one of which is resiliently mounted, movable relative to one another in response to multimorph flexure;
means for applying an electrical potential to said multimorph in a magnitude sufficient to cause flexure of said multimorph whereby to actuate said contacts;
means for developing an electric field polarized such that it extends in a direction having a component parallel with the plane of movement of said multimorph and positioned such that a part of said multimorph is subjected to said field whereby flexure of said multimorph as an incident to excitation will be altered by said field;
said multimorph comprising strips of piezoelectric material, and a layer of conductive material fixed to a side of said strips;
said means for developing an electric field being effective to form the field such that it terminates at said layers of conductive material;
said frame being electrically conductive and said field extending from said frame to said layer of conductive material;
said means for applying an electrical potential to said multimorph comprising a diode rectifier connected in series with a circuit that includes a resistor connected in parallel with at least one piezo-electric element of said multimorph whereby a series time delay circuit is provided for discharge of said element upon removal of said excitation; and said means for applying an electrical potential further comprising the series combination of a load impedance and the emitter-collector circuit of a transistor, the diode being connected to the junction between the impedance and the emitter-collector circuit.

11. In combination:
a frame;
a multimorph of piezo-electric material having a fixed part carried by said frame and a movable part free to flex in a plane of movement upon excitation of the multimorph;
a pair of electrical contacts, at least one of which is resiliently mounted, movable relative to one another in response to multimorph flexure;
means for applying an electrical potential to said multimorph in a magnitude sufficient to cause flexure of said multimorph whereby to actuate said contacts;
means for developing an electric field polarized such that it extends in a direction having a component parallel with the plane of movement of said multimorph and positioned such that a part of said multimorph is subjected to said field whereby flexure of said multimorph as an incident to excitation will be altered by said field;
said multimorph comprising strips of piezoelectric material, and a layer of conductive material fixed to a side of said strips;
said means for developing an electric field being effective to form the field such that it terminates at said layers of conductive material;
said frame being electrically conductive and said field extending from said frame to said layer of conductive material; and
said means for applying a potential comprising a variable resistor connected in circuit with said multimorph, the variable resistor being responsive to the state of a condition to vary current flow to the bimorph sufficiently to permit switch closure in one state of said condition and to prevent it in another.

12. In combination:
a resilient member;
a multimorph having at least one portion formed of piezo-electric material;
a pair of switch contacts and means for connecting one of said contacts for movement into and out of engagement with the other of said contacts as an incident to movement of said multimorph;
mounting means for mounting said contacts as an incident to movement of said multimorph being opposed by forces stored in said resilient member;
said means for applying an electrical potential to said multimorph comprising a source of an electrical potential and a CMOS device connected between said source of electrical potential and said multimorph; and
said means for applying an electrical potential to said multimorph further comprising means for controlling conductivity of said CMOS device.

* * * * *